(12) United States Patent
Azdasht et al.

(10) Patent No.: US 7,717,316 B2
(45) Date of Patent: May 18, 2010

(54) METHOD AND DEVICE FOR APPLYING A SOLDER TO A SUBSTRATE

(75) Inventors: Ghassem Azdasht, Berlin (DE); Lars Titerle, Berlin (DE)

(73) Assignee: Pac Tech-Packaging Technologies GmbH, Nauen (DE)

( * ) Notice: Subject to any disclaimer, the term of this patent is extended or adjusted under 35 U.S.C. 154(b) by 271 days.

(21) Appl. No.: 11/787,896

(22) Filed: Apr. 18, 2007

(65) Prior Publication Data
US 2007/0257090 A1    Nov. 8, 2007

(30) Foreign Application Priority Data
Oct. 7, 2001    (DE) ................. 101 32 567

(51) Int. Cl.
*B23K 31/02*    (2006.01)
*B23K 3/06*    (2006.01)

(52) U.S. Cl. ........................ 228/246; 228/41
(58) Field of Classification Search ............. 228/246, 228/41, 20.1
See application file for complete search history.

(56) References Cited

U.S. PATENT DOCUMENTS

| | | | | |
|---|---|---|---|---|
| 6,152,348 A | * | 11/2000 | Finn et al. | 228/41 |
| 6,336,581 B1 | * | 1/2002 | Tuchiya et al. | 228/33 |
| 6,589,594 B1 | * | 7/2003 | Hembree | 438/106 |

FOREIGN PATENT DOCUMENTS

| | | |
|---|---|---|
| DE | 43 20 055 A1 | 12/1994 |
| DE | 195 41 996 A1 | 5/1997 |
| WO | WO 02/28588 A1 | 4/2002 |

\* cited by examiner

*Primary Examiner*—Kevin P Kerns
(74) *Attorney, Agent, or Firm*—Ralph H. Dougherty

(57) ABSTRACT

A method for applying a solder to a substrate by positioning solder in a solid state, melting it and then impacting it against a substrate by the action of compressed gas. The method utilizes a holder having a capillary bore whose diameter, at the substrate end, has a contraction whose diameter (D2) is smaller than the diameter (D3) of the solder globule, an energy source connected to the capillary, and a compressed gas source connected to the capillary.

10 Claims, 1 Drawing Sheet

METHOD AND DEVICE FOR APPLYING A SOLDER TO A SUBSTRATE

This application is a divisional application of U.S. patent application Ser. No. 10/468,688 filed Aug. 20, 2003, now abandoned.

The invention concerns a process and a device for applying solder onto a substrate including providing solder in a solid aggregate state, positioning solder relative to the substrate, providing an energy source, and melting the solder by activating the supply of energy.

Such processes and devices are known from German patents DE 43 20 055 A1, DE 42 00 492 C2, and DE 195 33 171 A1. These processes and devices have a holder with a capillary. The holder is placed with its tip near the solder point, and then a solder ball is fed through the capillary and the solder ball contacts the solder point. The solder ball is then melted through the capillary. The melting is preferably performed using laser energy.

To transport the solder ball within the capillary, DE 43 20 055 A1 proposes to arrange a movable optical fiber within the capillary, so that the optical fiber acts as a ram for moving the solder ball and is simultaneously also used for feeding laser energy.

DE 195 33 171 A1 instead proposes to transport the solder ball by the force of gravity, vibration, particularly ultrasound, and an air flow. In addition, for DE 195 44 929 A1, solder balls are transported by the pressure of a protective gas.

In the prior art, however, the solder ball always contacts the substrate or the surface to be wetted with the solder material at the moment of melting. This requires that the tip of the holder must be positioned very close against the substrate, wherein on the one hand, the solder ball is still held in the capillary, and on the other hand, however, the solder ball is already in contact with the substrate. Because the solder balls in many cases have a diameter of a few microns, this requires extremely precise positioning of the holder and there is the risk that the holder will collide with parts on the substrate during positioning.

The problem of the invention is to improve upon the known process and device in such a way that a sufficiently precise placement of the solder material on the substrate is achieved while simultaneously reducing the positioning accuracy requirements of the holder.

The fundamental principle of the invention is to position the solder in a solid aggregate state and to hold it at a distance from the substrate. Then, through the supply of energy, the solder is melted and finally pushed against the substrate by a compressed gas. Regarding the device, the capillary is tapered near the tip so that its diameter is smaller than the diameter of the solder ball.

Thus, the ball falls down to the tapered section and is held there. The holder is then positioned at a sufficient distance above the substrate. Then the ball is melted, preferably by laser light, and pushed against the surface to be soldered by compressed gas. The distance between the tip of the holder and the substrate is therefore no longer critical, so that in terms of this distance, the positioning accuracy requirements are reduced. simultaneously, the positioning accuracy requirements in the plane of the substrate (X/Y plane) are also reduced. In the prior art, the ball could move in the X/Y plane at the solder position if the lower edge of the capillary from the substrate had a greater distance than the radius of the solder ball. In contrast, such a motion is not possible with the invention and the center of the capillary also corresponds to the center of the solder ball.

Another advantage is that all of the laser energy is definitely incident on the solder ball and cannot pass the solder ball.

The compressed gas for pushing the melted solder material is preferably a protective gas, e.g., an inert gas.

The solder can be not only solder tin, but also other meltable materials, e.g., also plastics.

BRIEF DESCRIPTION OF THE DRAWINGS

In the following, the invention is described in more detail with reference to an embodiment in connection with the drawing. Shown are.

DETAILED DESCRIPTION

Figure 1:
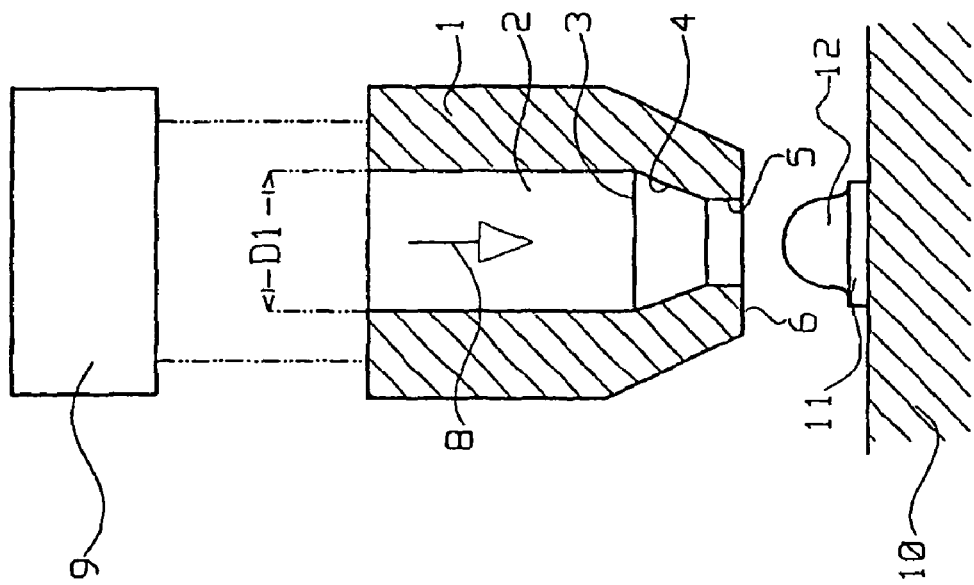
FIG. 1, a schematic diagram of the device before melting of the solder ball.

FIG. 1 shows schematically a holder 1 with a capillary 2, which has a first diameter D1. At the lower end 3 of the capillary 2 there is a conical tapered section, which runs to a conical point starting from the first diameter D1 down to a second diameter D2 and thus forms a tapered outlet 5 at the tip 6 of the holder. The diameter D1 and D2 are set relative to the diameter D3 of the solder ball 7 such that the first diameter D1 of the capillary 2 is larger than the diameter of the solder ball and the second diameter D2 at the outlet 5 of the tapered section is smaller than the diameter D3 of the solder ball. In this way, the solder ball is easily guided from above in the direction of arrow 8 to the tapered section 4, even just by the force of gravity. The solder ball is held at the tapered section 4 and it partially seals the capillary from the top. In an optimum arrangement, there is absolutely no gap, through from which light, particularly laser light, could exit the capillary, when there is a solder ball 7 in the tapered section 4.

The feeding of a solder ball to the capillary is performed in a known way (cf., e.g., DE 195 44 929 A1 or DE 195 33 171 A1) by a device, which is designated in general by the reference numeral 9, for gathering single balls, for feeding, for control, and for generating laser light.

Figure 2:
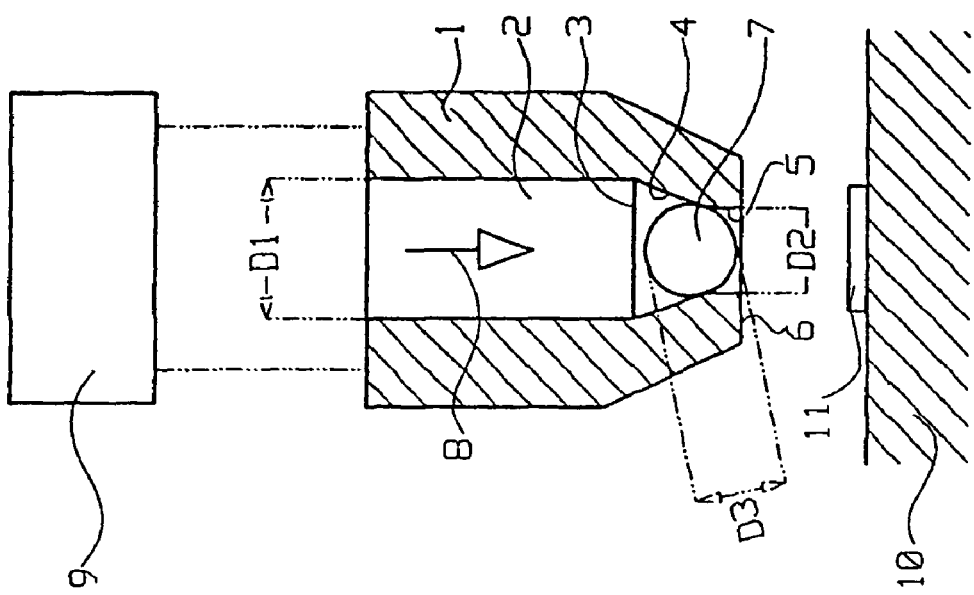
FIG. 2, a diagram similar to FIG. 1, but after the melting of the solder ball.

As illustrated in FIG. 1, the holder with the solder ball still held at the tip of the holder is positioned above a substrate 10, e.g., in the region of a conductive trace 11, at a certain vertical distance from the substrate or the conductive trace 11. In this position, there is no contact between the solder ball 7 and the conductive trace 11. Then the solder ball 7 is melted by laser light or some other energy source and pushed out of the capillary by compressed gas and "accelerated", so that it wets the surface to be wetted, e.g., the conductive trace 11, as a "bumper" 12, as illustrated in FIG. 2.

Because the melted solder ball is accelerated by compressed gas, which is preferably activated in pulses, and thus strikes the substrate with some velocity, the wetting is also improved, because the melted solder material also penetrates into small surface irregularities, gaps, or the like in the substrate or the conductive trace due to the impact pulse.

What is claimed is:

1. Process for applying solder on a substrate comprising the following steps:
   a. moving a solder ball in a solid aggregate state to and within a tip of a capillary,
   b. holding the solder ball at the tip of the capillary by a conical tapered section of the capillary, whose diameter (D2) is smaller than the diameter (D3) of the solder ball, c. positioning the tip of the capillary at a predetermined distance from the substrate, d. melting and retaining the solder ball within the tip of the tapered capillary, and e. pushing the molten solder ball from the capillary by applying a gas pressure to the capillary to impact the molten solder against the substrate.

2. A process according to claim 1, characterized in that the melting is performed through laser energy.

3. A process according to claim 1, characterized by activating a compressed gas in pulses.

4. A process according to claim 1, characterized in that the gas pressure is provided by a compressed gas which is an inert or protective gas.

5. A method for applying a solder ball having a predetermined diameter onto a substrate, the method comprising:

providing a holder having a capillary (2) therein, the capillary having a solder entry end and a solder discharge end at a sufficient vertical distance from the substrate that there is no contact by the solder ball with the substrate;

positioning a solder ball within the capillary discharge end, wherein the discharge end of the capillary has a tapered discharge section with the smaller diameter of the tapered section being at the discharge end, a diameter (D1) of the capillary entry end being greater than a diameter (D3) of the solder ball, a smallest diameter (D2) of the capillary being smaller than the diameter (D3) of the solder ball;

providing an energy source communicating with said capillary;

melting the solder ball by application of the energy source; and ejecting the molten solder ball from the capillary onto the substrate.

6. A method according to claim 5 wherein ejection of the solder ball is accomplished by the action of a compressed gas in the interior of the capillary.

7. A method according to claim 6, further comprising activating the compressed gas in pulses.

8. A method according to claim 6, wherein the compressed gas is an inert or protective gas.

9. A method according to claim 5 wherein the energy source is a laser.

10. A method according to claim 5 wherein the substrate is a conductive trace.

* * * * *